(12) United States Patent
Che et al.

(10) Patent No.: US 11,726,536 B2
(45) Date of Patent: Aug. 15, 2023

(54) SYSTEM AND METHOD FOR INCREASING POWER SUPPLY PEAK POWER CAPACITY

(71) Applicant: Dell Products L.P., Round Rock, TX (US)

(72) Inventors: Wu Chi Che, Taipei (TW); Wei-Cheng Yu, New Taipei (TW); Edward Douglas Knapton, Pflugerville, TX (US); Tsung-Cheng Liao, Taoyuan (TW); Yung-Chang Chang, New Taipei (TW); Ya-Tang Hsieh, New Taipei (TW)

(73) Assignee: Dell Products L.P., Round Rock, TX (US)

( * ) Notice: Subject to any disclaimer, the term of this patent is extended or adjusted under 35 U.S.C. 154(b) by 27 days.

(21) Appl. No.: 17/513,985

(22) Filed: Oct. 29, 2021

(65) Prior Publication Data

US 2023/0134151 A1    May 4, 2023

(51) Int. Cl.
*G06F 1/26* (2006.01)
*H03K 5/156* (2006.01)
*G06F 13/42* (2006.01)

(52) U.S. Cl.
CPC ............ *G06F 1/26* (2013.01); *G06F 13/4282* (2013.01); *H03K 5/1565* (2013.01); *G06F 2213/0016* (2013.01)

(58) Field of Classification Search
CPC ................... G06F 1/26; G06F 13/4282; G06F 2213/0016; H03K 5/1565
See application file for complete search history.

(56) References Cited

U.S. PATENT DOCUMENTS

| | | | |
|---|---|---|---|
| 2008/0157745 A1* | 7/2008 | Nakata | H02M 3/156 323/304 |
| 2016/0162018 A1* | 6/2016 | Rahardjo | G06F 1/3206 713/323 |
| 2021/0232164 A1* | 7/2021 | Wong | G06F 1/324 |

* cited by examiner

*Primary Examiner* — Glenn A. Auve
(74) *Attorney, Agent, or Firm* — McDermott Will & Emery LLP

(57) ABSTRACT

A method for increasing power supply voltage in an information handling system in a normal mode with a first peak voltage comprises, in response to receiving a request for a higher peak voltage, an embedded controller (EC) receiving information associated with the application including a request for power at a higher peak voltage, a housekeeping IC communicating a signal to a PWM IC to increase voltage supplied to the information handling system to the higher peak voltage, the PWM IC converting from the PSU to the higher peak voltage and starting a timer with a defined time period. If no additional requests for operating at the higher peak voltage are received before the time period expires, the PWM IC communicates a signal that power will stop being supplied at the higher peak voltage, and the information handling system returns to operating in the normal mode at the first peak voltage.

18 Claims, 4 Drawing Sheets

SYSTEM AND METHOD FOR INCREASING POWER SUPPLY PEAK POWER CAPACITY

BACKGROUND

Field of the Disclosure

This disclosure relates generally to information handling systems and, more particularly, to methods for increasing the power supply peak power capacity.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

Embodiments disclosed herein may be directed to a method for increasing voltage supplied to an information handling system. An information handling system may power on and a power supply unit (PSU may supply power to the information handling system at a first voltage. In response to the information handling system receiving a request to start executing an application, an embedded controller (EC) monitoring the information handling system may receive information associated with the application including a request for power at a second voltage that is higher than the first voltage. The EC may communicate a signal to the PSU to supply power at the second voltage. A housekeeping integrated circuit (IC) in the PSU may receive the signal and communicate a signal to a pulse width modulation (PWM) IC in the PSU to convert power supplied by the PSU to the second voltage based on the request to start the application. The PWM IC may convert the power from the first voltage to the second voltage and initiate a timer defining a time period. After the time period expires, the PWM IC may determine there are no additional requests for power at the second voltage and communicate a signal to the housekeeping IC that the PWM IC will stop converting power to the second voltage, wherein the housekeeping IC communicates information to the EC that the PSU will stop supplying power at the second voltage and the PSU supplies power to the information handling system at the first voltage.

Embodiments disclosed herein may utilize an Inter-Integrated Circuit (I2C) interface for communicating between the information handling system and the housekeeping IC and may use a UART channel for communicating between the housekeeping IC and the PWM IC.

BRIEF DESCRIPTION OF THE DRAWINGS

For a more complete understanding of the invention and its features and advantages, reference is now made to the following description, taken in conjunction with the accompanying drawings, in which.

DESCRIPTION OF PARTICULAR EMBODIMENT(S)

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and one or more video displays. The information handling system may also include one or more buses operable to transmit communication between the various hardware components.

Particular embodiments are best understood by reference to FIGS. 1, 2 and 3A-3B, wherein like numbers are used to indicate like and corresponding parts.

Figure 1:
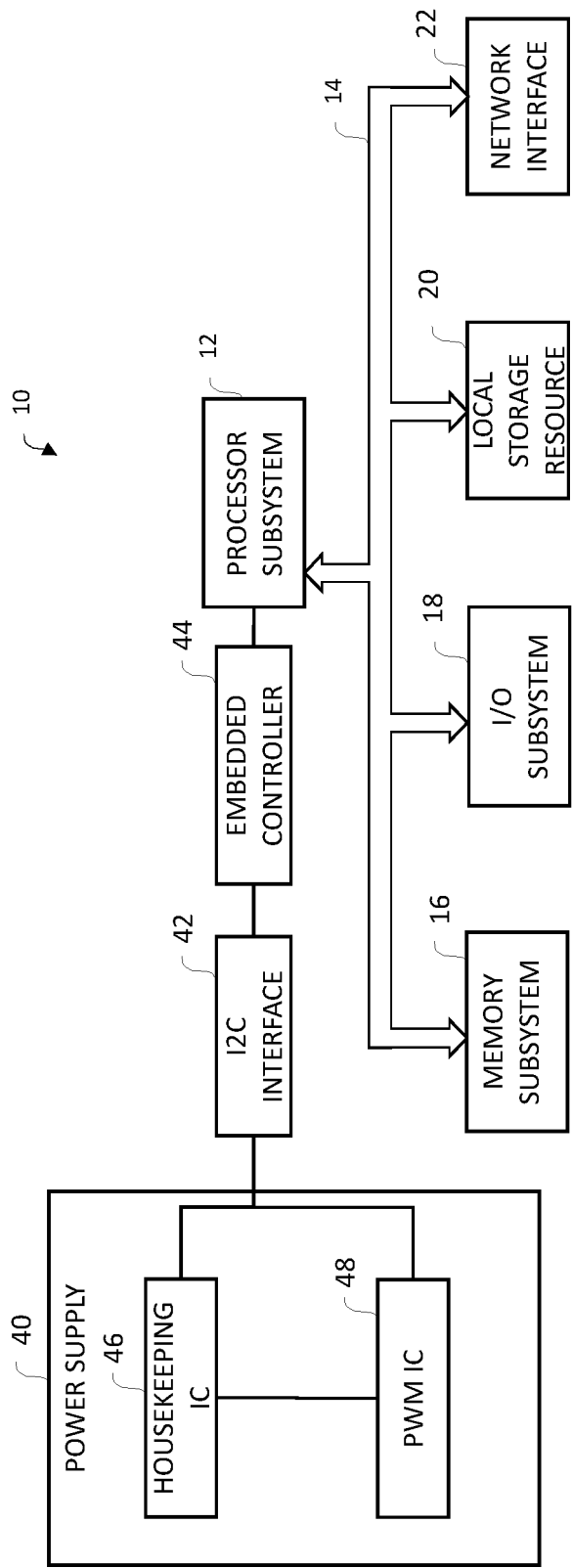
FIG. 1 is a block diagram of selected elements of an embodiment of an information handling system.

Turning to the drawings, FIG. 1 illustrates a block diagram depicting selected elements of an embodiment of information handling system 10. It is noted that FIG. 1 is not drawn to scale but is a schematic illustration.

As shown in FIG. 1, components of information handling system 10 may include, but are not limited to, a processor subsystem 12, which may comprise one or more processors, and a system bus 14 that communicatively couples various system components to processor subsystem 12 including, for example, a memory subsystem 16, an I/O subsystem 18, local storage resource 20, and network interface 22. Information handling system 10 may further include power supply 40 configured for supplying electric power having a voltage and Inter-Integrated Circuit (I2C) interface 42 for communicating with embedded controller (EC) 44, housekeeping integrated circuit (IC) 46 and pulse width modulation (PWM) IC 48.

Processor subsystem 12 may comprise a system, device, or apparatus operable to interpret and execute program instructions and process data, and may include a microprocessor, microcontroller, digital signal processor (DSP), application specific integrated circuit (ASIC), or another digital or analog circuitry configured to interpret and execute program instructions and process data. In some embodiments, processor subsystem 12 may interpret and execute program instructions and process data stored locally (e.g., in memory subsystem 16). In the same or alternative embodiments, processor subsystem 12 may interpret and execute program instructions and process data stored remotely (e.g., in a network storage resource).

System bus 14 may refer to a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

Memory subsystem 16 may comprise a system, device, or apparatus operable to retain and retrieve program instructions and data for a period of time (e.g., computer-readable media). Memory subsystem 16 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 10, I/O subsystem 18 may comprise a system, device, or apparatus generally operable to receive and transmit data to or from or within information handling system 10. I/O subsystem 18 may represent, for example, a variety of communication interfaces, graphics interfaces, video interfaces, user input interfaces, and peripheral interfaces. In various embodiments, I/O subsystem 18 may be used to support various peripheral devices, such as a touch panel, a display adapter, a keyboard, a touch pad, or a camera, among other examples. In some implementations, I/O subsystem 18 may support so-called 'plug and play' connectivity to external devices, in which the external devices may be added or removed while information handling system 10 is operating.

Local storage resource 20 may comprise computer-readable media (e.g., hard disk drive, floppy disk drive, CD-ROM, and other type of rotating storage media, flash memory, EEPROM, or another type of solid-state storage media) and may be generally operable to store instructions and data.

Network interface 22 may be a suitable system, apparatus, or device operable to serve as an interface between information handling system 10 and a network (not shown). Network interface 22 may enable information handling system 10 to communicate over a network using a suitable transmission protocol or standard. In some embodiments, network interface 22 may be communicatively coupled via a network to a network storage resource (not shown). A network coupled to network interface 22 may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and messages (generally referred to as data). A network coupled to network interface 22 may transmit data using a desired storage or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), or any combination thereof. A network coupled to network interface 22 or various components associated therewith may be implemented using hardware, software, or any combination thereof.

Information handling system 10 may receive power from power supply unit (PSU) 40. PSU 40 may be configured to supply electric power up to a first voltage to enable other components of information handling system 10 to process information associated with applications executing on information handling system 10. The first voltage may be a peak power voltage (e.g., 380 V) based on specifications of PSU 40 or information handling system 10.

Embodiments disclosed herein include a system and method for increasing the voltage supplied by PSU 40 to support temporary demands as requested by applications executing on information handling system 10. Information handling system 10 may include embedded controller (EC) 44 for monitoring information handling system 10 including determining if an application executing on information handling system 10 is requesting or requiring a voltage higher than a peak voltage associated with a high-efficiency mode. PSU 40 includes housekeeping integrated circuit (IC) 46 and pulse width modulation (PWM) IC 48 for monitoring PSU 40 and capable of increasing the voltage of power supplied by PSU 40, discussed in greater detail below.

Housekeeping integrated circuit (IC) 46 may comprise sensing circuitry to regulate and protect PSU 40 from over-voltage and under-voltage conditions.

PWM IC 48 may form part of a DC-to-DC converter circuit for increasing voltage from a first voltage to a second (higher) voltage. The first voltage may be a peak power voltage associated with a high-efficiency operating mode, which is often referred to as a normal mode. The second voltage may be associated with a high-performance mode, which may also be referred to as a turbo peak power mode. In some embodiments, housekeeping IC 46 and PWM IC 48 communicate via a universal asynchronous receiver-transmitter (UART) channel. Using the UART channel, if housekeeping IC 46 is operating in a transmitter-enabled (TX-enabled) mode, PWM IC 48 must operate in a receiver-enabled (RX-enabled) mode and if PWM IC 48 is operating in a transmitter-enabled (TX-enabled) mode, housekeeping IC 46 must operate in a receiver-enabled (RX-enabled) mode.

Method for Increasing Voltage

Figure 2:
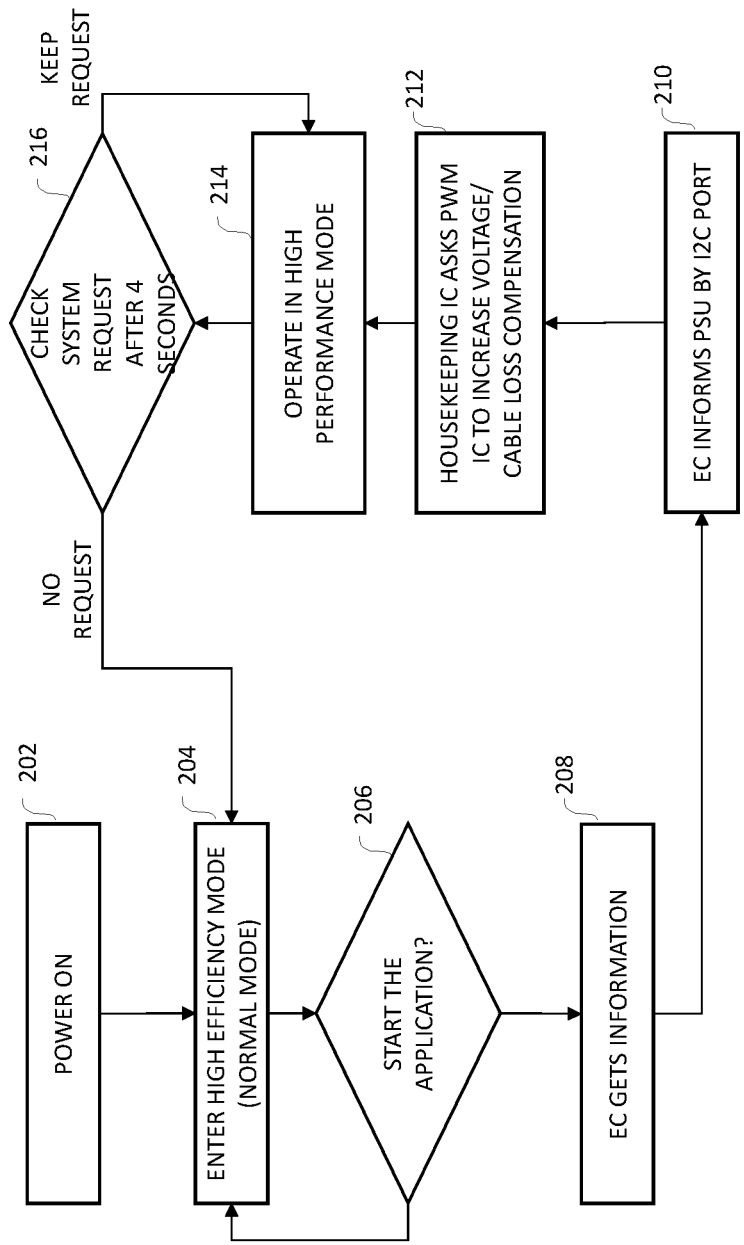
FIG. 2 is a flow diagram of a method for managing voltage supply to an information handling system.
Figure 3A:
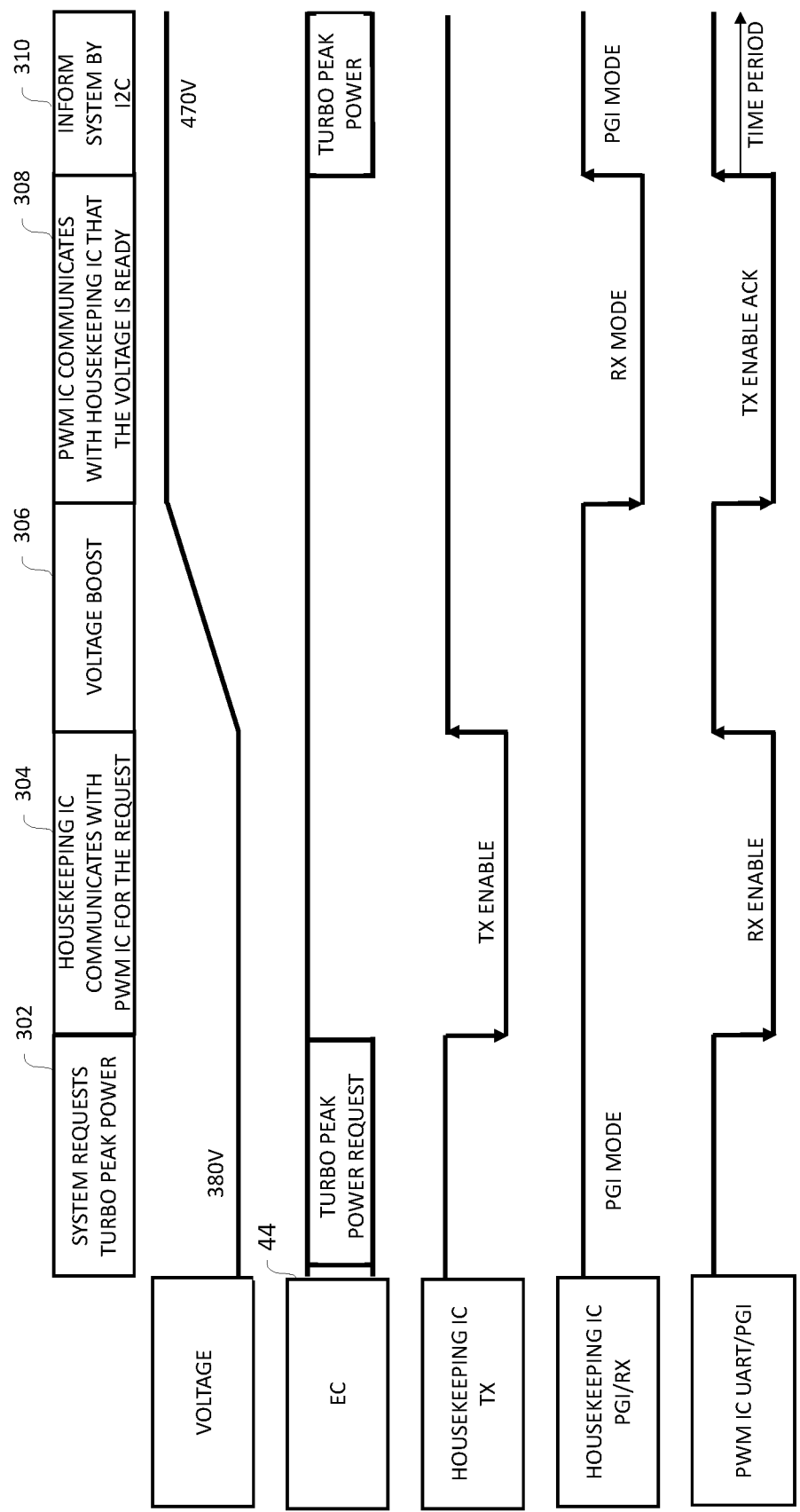
FIGS. 3A and 3B are flow charts depicting a method for increasing peak power supply to an information handling system and returning the information handling system to a normal mode.
Figure 3B:
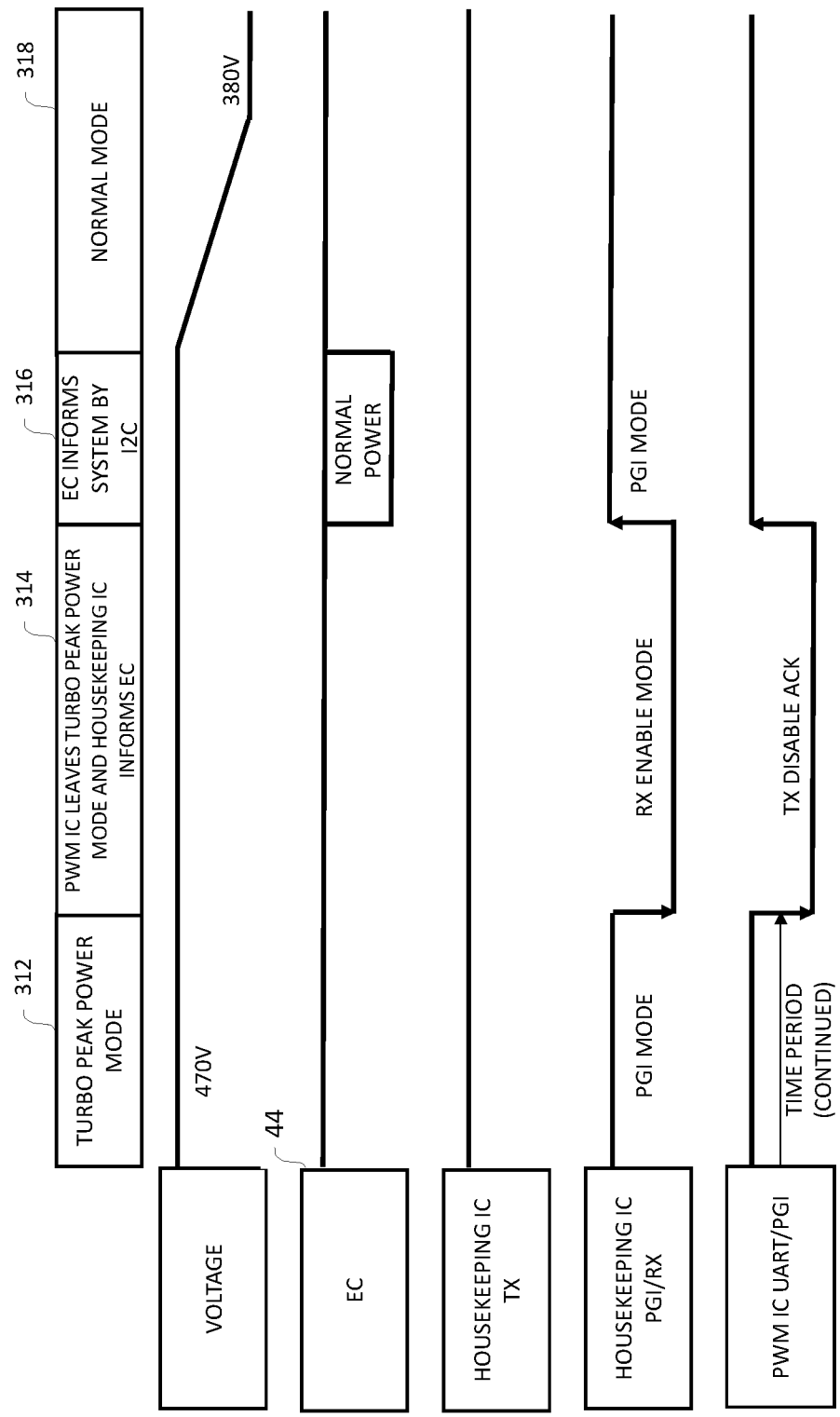

Referring to FIGS. 2 and 3A and 3B, FIG. 2 depicts a high-level flow diagram 200 for increasing the voltage of power supplied by PSU 40 and FIGS. 3A and 3B depict portions of a flow chart illustrating communication between components in PSU 40 to perform steps in flow diagram 200 and illustrating changes in voltage of power supplied by PSU 40.

At step 202 in FIG. 2, information handling system 10 is turned on.

At step 204 in FIG. 2, information handling system 10 begins operating with PSU 40 supplying power at a first voltage. The first voltage may be a peak voltage associated with information handling system 10 operating in a high-efficiency (normal) mode. As depicted in FIG. 3A, in a normal mode, PSU 40 may supply power at a first voltage. The first voltage may be, for example, 380 Volts (V). When information handling system 10 is operating in a normal mode, housekeeping IC 46 may operate in porthole gateway interface (PGI) mode to monitor PSU 40 to protect PSU 40 from over-voltage and under-voltage conditions.

At step 206 in FIG. 2, a signal to start an application may be received by information handling system 10. The application may be a game or other application initiated by a user and may require additional power or benefit from power supplied at a higher voltage.

At step 208, embedded controller (EC) 44 gets requested voltage information for the application. In some embodiments, EC 44 monitors information handling system 10 including monitoring applications executing on information handling system 10 to determine if more power is required or requested.

At step 210, EC 44 communicates with PSU 40 to request an increase in voltage supplied by PSU 40. EC 44 may communicate the request over I2C interface 42 to housekeeping IC 46 in PSU 40. Referring to FIG. 3A, at step 302, EC 44 may communicate a request or signal that information handling system 10 is requesting power at a second voltage (e.g., a request for turbo peak power). The request may be received by housekeeping IC 46 operating in PGI mode. Housekeeping IC 46 may determine that PSU 40 is capable of providing power at the second voltage for a time period.

At step 212, housekeeping IC 42 sends a request to PWM IC 48 to increase the voltage to the second voltage. Referring to FIG. 3A, in some embodiments, at step 304, housekeeping IC 46 may switch to operating in a transmitter-enabled (TX-enabled) mode to communicate over a UART channel with PWM IC 48 operating in a receiver-enabled (RX-enabled) mode to receive the request with the second voltage information. In some embodiments, the request to increase voltage includes information to enable PWM IC 48 to compensate for cable losses.

Referring to FIG. 3A, the voltage of power supplied by PSU 40 may be increased (boosted) to the second voltage (e.g., 470V).

Before power is supplied at the second voltage to information handling system 10, embodiments may perform steps such that information handling system 10 can transition to operating at the higher voltage without damage.

Referring to FIG. 3A, at step 308, PWM IC 48 may switch from operating in RX-enabled mode to operating in a TX-enabled mode and communicate an acknowledgement (e.g., TX-enable_ack) to housekeeping IC 46 to indicate the voltage of power supplied by PSU 40 has reached the second voltage.

At step 310, EC 44 may inform information handling system 10 using the I2C interface that power is being supplied to information handling system 10 at the second voltage (e.g., turbo peak power). Also, at step 310, housekeeping IC 46 switches from operating in a RX-enabled mode to operating in the PGI mode, and PWM IC 48 initiates a timer for a time period (e.g., for 4 seconds).

At step 214, information handling system 10 may operate in a second mode such as a high-performance mode, wherein the second mode requires a higher voltage than the first voltage. Referring to FIG. 3B, at step 312, PSU 40 may supply power at a second voltage (e.g., 470 V) to information handling system 10 to provide power to operate in a high-performance mode (e.g., turbo peak power). Housekeeping IC 46 may operate in PGI mode to monitor conditions of PSU 40 and PWM IC 48 continues monitoring the timer to determine when the time period has expired.

At step 216, information handling system 10 may check for a system request after a time period has expired (e.g., after 4 seconds). If there is a request to keep supplying power at the second voltage, PSU 40 may continue operating at the second voltage as long as housekeeping IC 46 determines PSU 40 is capable. If there is not a request to keep supplying power at the second voltage, information handling system 10 may perform steps to leave the second (e.g., high-power) mode and return to the first (e.g., normal) mode.

Referring to FIG. 3B, if there is more high voltage requirement or no request to continue supplying the second voltage, then at step 314, PWM IC 48 communicates a TX-disable acknowledgement to housekeeping IC 46 operating in the RX-enabled mode. Housekeeping IC 46 informs EC 44 that PWM IC 48 is going to leave the second (higher) peak power mode.

At step 204, information handling system 10 returns to operating at the first voltage. At step 316, EC 44 informs information handling system 10 that PSU 40 is going to supply power to information handling system 10 at the first voltage.

At step 318, power supplied by PSU 40 drops to the first voltage and information handling system 10 operates in a normal mode with PSU 40 providing power at the first voltage (e.g., 380 V).

Embodiments disclosed herein allow information handling systems 100 operating at a power level with a first voltage to operate at a higher voltage for a time period. The ability to operate at a higher voltage—even if only for a limited time period—enables information handling system 10 to process information and perform functions such that information handling system 10 does not need to throttle power and PSU 40 does not need to be oversized to accommodate situations in which more power is needed for limited time periods. For example, in power supply units operating under a D10 200 W specification, a typical information handling system may operate at a peak load for 10 ms at approximately 460%, whereas embodiments disclosed herein may operate at a peak load of 514% for 10 ms and other embodiments may operate at a peak load of 754% for 10 ms.

The above disclosed subject matter is to be considered illustrative, and not restrictive, and the appended claims are intended to cover all such modifications, enhancements, and other embodiments which fall within the true spirit and scope of the disclosure. Thus, to the maximum extent allowed by law, the scope of the disclosure is to be determined by the broadest permissible interpretation of the following claims and their equivalents, and shall not be restricted or limited by the foregoing detailed description.

What is claimed is:

1. A method for increasing a voltage of power supplied to an information handling system, the method comprising:
   in response to the information handling system powering on, a power supply unit (PSU) supplying power to the information handling system at a first voltage;

in response to the information handling system receiving a request to start executing an application:
receiving, by an embedded controller (EC), information associated with the application, the information including a request for power at a second voltage higher than the first voltage;
communicating, from a housekeeping integrated circuit (IC) to a pulse width modulation (PWM) IC, a signal to increase the first voltage to the second voltage;
increasing, by the PWM IC, the first voltage to the second voltage; communicating, from the housekeeping IC to the EC, information that the
PSU is supplying power at the second voltage;
initiating, by the PWM IC, a timer defining a time period;
determining that no additional request for power at the second voltage is received before the time period expires; and
communicating, from the PWM IC to the housekeeping IC, a signal that the PSU will stop supplying power at the second voltage, wherein the housekeeping IC communicates information to the EC that the PSU will stop supplying power at the second voltage and the PSU supplies power to the information handling system at the first voltage.

2. The method of claim 1, wherein the EC communicates with the housekeeping IC over an Inter-Integrated Circuit (I2C) interface.

3. The method of claim 1, wherein communicating a signal from the housekeeping IC to the PWM IC to increase the first voltage to the second voltage comprises compensating for cable losses.

4. The method of claim 1, wherein communicating a signal from the housekeeping IC to the PWM IC to increase the first voltage to the second voltage comprises the housekeeping IC switching from operating in a porthole gateway interface (PGI) mode to operating in a transmitter-enabled mode and the PWM IC operating in a receiver-enabled mode and communicating over a universal asynchronous receiver-transmitter (UART) channel.

5. The method of claim 4, further comprising the PWM IC communicating a signal to the housekeeping IC after the power is supplied at the second voltage.

6. The method of claim 5, further comprising the housekeeping IC communicating a signal to the embedded controller after the power is supplied at the second voltage.

7. A system for increasing a voltage associated with power supplied to an information handling system by a power supply unit (PSU) at a first voltage, the system comprising:
an embedded controller (EC) executing instructions to:
monitor the information handling system;
receive information associated with an application executing on the information handling system, the information including a request for the power to be supplied at a second voltage higher than the first voltage; and
communicate a signal to the PSU to increase the voltage from the first voltage to the second voltage;
a housekeeping integrated circuit (IC) in the PSU, the housekeeping IC executing instructions to receive the signal from the EC to increase the voltage from the first voltage to the second voltage; and
a pulse width modulation (PWM) IC in the PSU, wherein the housekeeping IC communicates a signal to the PWM IC to increase the voltage from the first voltage to the second voltage; and
the PWM IC executes instructions to:
receive the signal from the housekeeping IC;
increase the voltage from the first voltage to the second voltage;
initiate a timer defining a time period;
determine that no additional request for the power to be supplied at the second voltage is received before the time period expires; and
communicate a signal to the housekeeping IC that the PSU will stop supplying the power at the second voltage,
wherein the housekeeping IC executes instructions to communicate information to the EC that the PSU will stop supplying the power at the second voltage; and
the PSU supplies the power to the information handling system at the first voltage.

8. The system of claim 7, wherein the EC communicates with the housekeeping IC over an Inter-Integrated Circuit (I2C) interface.

9. The system of claim 7, wherein the housekeeping IC executes instructions to communicate the signal to the PWM IC to increase the voltage from the first voltage to the second voltage to compensate for cable losses.

10. The system of claim 7, wherein the housekeeping IC executes instructions to operate in a transmitter-enabled mode to communicate the signal to the PWM IC to increase the voltage from the first voltage to the second voltage and the PWM IC executes instructions to operate in a receiver-enabled mode to receive the signal to increase the voltage from the first voltage to the second voltage, wherein the communication occurs over a universal asynchronous receiver-transmitter (UART) channel.

11. The system of claim 10, wherein the PWM IC executes instructions to operate in a transmitter-enabled mode to communicate an acknowledgement to the housekeeping IC after the PSU is supplying the power at the second voltage.

12. The system of claim 11, wherein the housekeeping IC executes the instructions to communicate the signal to the EC after the PSU is supplying power at the second voltage.

13. An information handling system, comprising:
a processor subsystem for receiving a user input and executing an application based on the user input;
a power supply unit (PSU) for supplying power at a voltage to the information handling system, wherein the PSU is configured to initially supply the power at a first voltage; and
a system for increasing the voltage supplied to the information handling system, comprising:
an embedded controller (EC) configured to monitor the information handling system and receive information associated with the application including a request for the power to be supplied at a second voltage higher than the first voltage;
a housekeeping integrated circuit (IC) configured to receive a signal from the EC to increase the voltage from the first voltage to the second voltage;
a pulse width modulation (PWM) IC configured to:
receive the signal from the housekeeping IC;
increase the voltage from the first voltage to the second voltage;
initiate a timer defining a time period;
determine that no additional request for supplying the power at the second voltage is received before the time period expires; and
communicate a signal to the housekeeping IC that the PSU will stop supplying the power at the second voltage;

wherein the housekeeping IC executes instructions to communicate information to the EC that the PSU will stop supplying the power at the second voltage; and the PSU supplies the power to the information handling system at the first voltage.

14. The information handling system of claim 13, wherein the EC communicates the signal to increase the voltage from the first voltage to the second voltage to the housekeeping IC over an Inter-Integrated Circuit (I2C) interface.

15. The information handling system of claim 13, wherein the housekeeping IC executes instructions to communicate the signal to increase the voltage from the first voltage to the second voltage to the PWM IC to compensate for cable loss.

16. The information handling system of claim 13, wherein the housekeeping IC executes instructions to operate in a transmitter-enabled mode to communicate the signal to increase the voltage from the first voltage to the second voltage, wherein the PWM IC executes instructions to operate in a receiver-enabled mode and execute instructions to receive the signal to increase the voltage from the first voltage to the second voltage, wherein the communication occurs over a universal asynchronous receiver-transmitter (UART) channel.

17. The information handling system of claim 16, wherein the PWM IC executes instructions to operate in a transmitter-enabled mode to communicate an acknowledgement to the housekeeping IC operating in a receiver-enabled mode after the PSU is supplying the power at the second voltage.

18. The information handling system of claim 17, wherein the housekeeping IC executes instructions to communicate a signal to the EC after the PSU is supplying the power at the second voltage.

* * * * *